United States Patent
Kang et al.

(10) Patent No.: US 9,901,004 B2
(45) Date of Patent: Feb. 20, 2018

(54) HOUSING FOR ELECTRONIC CONTROL UNIT

(71) Applicant: CONTINENTAL AUTOMOTIVE GMBH, Hannover (DE)

(72) Inventors: Alan Kang, Rochester Hills, MI (US); Thomas Riepl, Bad Abbach (DE); Marius Tarnovetchi, Timisoara (RO)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 14/965,240

(22) Filed: Dec. 10, 2015

(65) Prior Publication Data

US 2016/0174404 A1   Jun. 16, 2016

(30) Foreign Application Priority Data

Dec. 10, 2014 (EP) .................................. 14465527

(51) Int. Cl.
*H05K 5/06* (2006.01)
*H05K 5/03* (2006.01)

(52) U.S. Cl.
CPC ............ *H05K 5/061* (2013.01); *H05K 5/03* (2013.01); *H05K 5/062* (2013.01); *H05K 5/068* (2013.01); *H05K 5/069* (2013.01)

(58) Field of Classification Search
CPC ........... H05K 5/061; H05K 5/03; H05K 5/062
See application file for complete search history.

(56) References Cited

U.S. PATENT DOCUMENTS

| | | | | |
|---|---|---|---|---|
| 4,298,204 A * | 11/1981 | Jinkins | .................. | F16J 15/062 220/378 |
| 6,192,895 B1 * | 2/2001 | Yuhara | ................. | A45C 13/008 132/294 |
| 6,779,802 B2 * | 8/2004 | Westra | ...................... | A47L 9/00 277/628 |
| 8,995,126 B2 * | 3/2015 | Rayner | ................. | G06F 1/1656 277/644 |
| 9,167,876 B2 * | 10/2015 | Yamaguchi | ............ | H05K 5/061 |
| 9,248,944 B2 * | 2/2016 | Miyagawa | ............. | F16J 15/024 |
| 2003/0184973 A1 | 10/2003 | Nagata et al. | | |
| 2004/0241357 A1 | 12/2004 | Berchtold et al. | | |
| 2006/0261452 A1 | 11/2006 | Berchtold et al. | | |

FOREIGN PATENT DOCUMENTS

JP    2011217547 A    10/2011

* cited by examiner

*Primary Examiner* — William H Mayo, III
*Assistant Examiner* — Hiram E Gonzalez
(74) *Attorney, Agent, or Firm* — Laurence A. Greenberg; Werner H. Stemer; Ralph E. Locher

(57) ABSTRACT

A housing for an electronic control unit is disclosed. The housing contains a main body having a base and a wall rising from the base, a cover supported on the wall opposite to the base and fixed to the housing for defining an inner volume, and a seat on the wall for a sealant interposed between the main body and the cover contributing to isolate the inner volume from an outer volume. The seat contains a portion adjoining the inner volume or the outer volume, the portion having an edge on the wall inclined with respect to the cover.

13 Claims, 2 Drawing Sheets

HOUSING FOR ELECTRONIC CONTROL UNIT

CROSS-REFERENCE TO RELATED APPLICATION

This application claims the priority, under 35 U.S.C. § 119, of European application EP 14465527, filed Dec. 10, 2014; the prior application is herewith incorporated by reference in its entirety.

BACKGROUND OF THE INVENTION

Field of the Invention

The present invention relates to a housing containing at least two parts sealed together by a sealant for isolating an inner volume from an external environment. The housing of the present invention may be particularly used for electronic control units, for example for automotive applications.

Electronic components of an electronic control unit normally need to be protected from the surrounding environment which could be dangerous for the normal functioning of the electronic components, for example due to the presence of pollutants, such as dust, water or oil. For this reason electronic components may be contained in the inner volume of a housing, which is sealed to prevent contact with the external environment.

With reference to the sectional view in FIG. 3, a housing 100 for an electronic control unit contains a bottom main body 110 and a cover 120 joined together. The main body 110 may be made of a plastic and/or metal material. The cover 120 may be made of a sheet-metal, of the same or of a different material with respect to the main body 110. In conventional housings 100, the cover 120 may be planar.

The main body 110 may include a base 115 and a perimeter wall 118 rising from the base 115. The base 115, seen from a top or bottom view (not represented) may have any shape, for example rectangular or circular. The perimeter wall 118 may be orthogonal (as shown in FIG. 1) or may be otherwise inclined with respect to the base 115.

For example on top of the perimeter wall 118, the cover 120 is supported and fixed in order to create a hollow structure with an inner volume 130 delimited at least by the main body 110, in particular by the base 115 and the perimeter wall 118, and the cover 120. Further components of the electronic control unit—such as an electrical connector—may contribute to separate the inner volume 130 from the surroundings of the control unit. The inner volume 130 is subject to house a plurality of electronic components, in particular one or more circuit boards which are equipped with the electronic components.

For example on top of the perimeter wall 118, the main body 110 may include a seat 119 for a sealant material 140, for example constituted by a gasket, an O-ring or a viscous dispensed material. Preferably, the sealant is a so-called formed-in-place gasket or cured-in-place gasket. In this case, a fluid sealant is dispensed onto the seat 119 or onto the cover 120 and cured subsequent to joining the cover 120 and the main body 110.

In the sectional view of FIG. 3, the seat 119 and the sealant material 140 are trapezoidal in cross-sectional shape, but other shapes are in general also possible, for example a shape of a circular sector or a rectangular shape. When the main body 110 and the cover 120 are joined together in the embodiment of FIG. 3, the sealant 140 is interposed between the top of the perimeter wall 118 and the cover 120, preventing contamination, for example dust, water or other pollutants, to the inner volume 130 from the external environment of the housing 100.

The housing 100 is normally subject to temperature variations, due to both self-heating of the electronic control unit and to variations in the climate conditions of the external environment. Accelerated tests to which electronic control units are subjected create even harsher temperature conditions. Differences in temperature between the sealed inner volume 130 and the external environment may cause also differences in pressure of a gas with which the inner volume 130 is filled.

Due to differences in the coefficients of thermal expansion of the main body 110 and of the sheet metal cover 120 and to positive or negative differences between internal and external pressure (overpressure or under-pressure, respectively), the housing 100 is subject to mechanical stress. Such stress may cause deformations of the sheet metal cover 120, which is thinner in comparison to the main body 110.

SUMMARY OF THE INVENTION

It is an object of the present invention to provide a housing for an electronic control unit, which has a particularly small risk of damage to the seal between the cover and the main body of the housing due to mechanical stress.

The object is achieved by a housing according to the independent claim. The dependent claims describe advantageous developments and modifications of the invention.

According to one aspect of the present invention, a housing for an electronic control unit is disclosed. The housing is in particular configured according to at least one of the above-described embodiments. In particular, it contains a main body, a cover and a sealant. The cover is in one embodiment a one-pieced sheet-metal part. In an alternative embodiment, it can be a plastic part, in particular a molded plastic part which may comprise a metallic liner or a metallic coating.

The housing for an electronic control unit contains:

a main body having a base and a wall rising from the base;

a cover supported on the wall opposite to the base and fixed to the housing for defining an inner volume the housing;

a seat on the wall for a sealant interposed between the main body and the cover contributing to isolate the inner volume from an outer volume outside the housing, wherein the seat contains at least a portion adjoining the inner volume or the outer volume, the portion having an edge on the wall inclined with respect to the cover.

According to one embodiment, the inclination of the edge is proportional to an expected angle of deformation of the cover.

In an expedient embodiment, the portion having the inclined edge adjoins the inner volume. The cover and the inclined edge shape a gap between the main body and the cover. The gap is bridged by the sealant. The gap has a width which increases in lateral inward direction towards the inner volume. In an expedient development, the cover bears on the wall in a region which follows the portion in a lateral outward direction, i.e. laterally away from the inner volume, opposite to the lateral inward direction.

Advantageously, the strain of the sealant may be particularly small over the whole lateral extent of the portion with the inclined edge. In particular, undesirably large strain at the interface of the sealant with the inner volume can be avoided. For example when the cover bears on the wall on a side of the sealing gap remote from the inner volume in lateral direction, the deflection of the cover due to pressure differences between the inner volume and the outer volume may increase in lateral inward direction from the bearing point of the cover on the wall to the interface of the sealant with the inner volume. By the inclined edge, the sealant thickness increases in the same direction, permitting to equalize the strain in the sealant over the lateral extension of the gap, in order that the maximum strain of the sealant and thus the stress on the sealant is particularly small.

In contrast thereto, in conventional housings the cover deformation is often large in regions where the thickness of the sealant material is small—e.g. at the interface between the inner volume and the sealing gap. Therefore, conventional housings may have a high risk to stress the sealant above the limit which may lead to an adhesion or cohesion sealant failure.

In case of the subject housing, additional fixations between the cover and the main body of the housing, provided to avoid permanent deformations and to limit the displacements to the elastic domain, can be advantageously be dispensed with.

For example, additional internal walls 112, 114 of the housing 100, rising from the base 115 and supporting the sheet metal cover 120 within the inner volume 130, as exemplary shown in FIG. 3 can be omitted. For example, the presence of additional internal walls 112, 114 limits the space available for the electronic circuit inside the inner volume 130. In addition, the presence of additional internal walls 112, 114 makes the main body 110 of the housing 100 more complex and therefore more expensive.

Additional fixation between the cover and the main body—such as a gluing material 141 (as between top of the internal wall 112 and the cover 120) or one or more screws 142, rivets or the like (as between internal wall 114 and the cover 120) exemplary shown in FIG. 3—can be omitted. The presence of additional fixations between the sheet metal cover 120 and the main body 110 of the housing 100 makes the assembly operations of the housing 100 longer.

In the present context, that the "portion has an inclined edge on the wall" is in particular to be understood to contain seat portions with a flat, planar surface which extends obliquely to the cover as well as seat portions with a curved surface to create a gap with laterally inward increasing width—in case of the portion adjoining the inner volume—or laterally outward increasing width—in case of the portion adjoining the outer volume—by use of the oblique or curved surface. The oblique or curved surface of the portion in particular represents a section of the top surface of the wall, remote from the base. The inclined edge is in particular the contour of the seat portion—and thus in particular of the top surface of the wall—in a cross-sectional view of the wall.

According to one embodiment, the seat contains at least a further portion on the side remote from the inner volume or outer volume, respectively, which the portion having the inclined edge adjoins. The further portion has a trapezoidal cross-sectional shape in one development. Expediently, the further portion is filled with a portion of the sealant. By means of the further portion, a particular tight seal is achievable.

In one embodiment, the portion having the inclined edge and the further portion shape a gap between the main body and the cover. The gap in particular extends continuously in the lateral outward direction from the interface of the portion having the inclined edge with the inner volume to a lateral edge of the further portion remote from the inner volume. The gap has a width which tapers from a first width at the interface of the portion having the inclined edge with the inner volume in the lateral outward direction towards the outer volume along the inclined edge and subsequently increases to a second width within the further portion. The second width is larger than the first width. It is in particular the maximum width of the gap. The gap is bridged by the sealant in the region of the portion having the inclined edge and in the further portion. It may expediently be filled—in particular completely filled with the sealant in the region of the further portion and preferably also in the region of the portion having the inclined edge. In a preferred development, the cover bears on the wall in a region which follows the portion having the inclined edge and the further portion in the lateral outward direction. With such a configuration, the risk for delamination of the sealant is particularly small and the seal is particularly tight.

In an advantageous embodiment, the inclination of the inclined edge and the width of the gap in the region of the portion having the inclined edge are adapted to one another in such fashion that, in every position along the inclined edge, the change of the width of the gap due to a maximum deformation of the cover expected during operation of the control unit is smaller than a predetermined strain of the sealant. The predetermined strain is a maximum allowable strain of the sealant. The "maximum allowable strain" may be specified in a datasheet of the sealant. It has in particular a value for which delamination is not expected.

In one development, the cover is deformable from an undeformed configuration to a deformed configuration due to pressure differences between the inner volume and the outer volume. Such pressure difference may result from temperature differences between the inner volume and the outer volume, for example. Such temperature difference may be generated due to operation of the electronic control unit and/or external influences such as temperature changes of the surroundings of the electronic control unit. The inclined edge, in a cross-sectional view of the gap, extends from a first lateral end position to a second lateral end position. At the first lateral end position, the inclined edge is distanced from the inner volume or from the outer volume, respectively, while it is in contact with the inner volume or with the outer volume, respectively, at the second lateral end position. The widths h1 and h2 of the gap in the undeformed configuration of the cover at the first and second lateral end positions, respectively, are set to be:

$$h1 = x1/\epsilon \text{ and } h2 = x2/\epsilon,$$

where x1, x2 are the displacements of the cover in direction of the gap width at the first and second lateral end positions from the undeformed configuration to the deformed configuration and ε is the predetermined strain of the sealant. In this way, the housing has a particularly small risk of damage to the seal between the cover and the main body of the housing due to mechanical stress.

According to one embodiment, the inclination β of the inclined edge is given by the relationship:

$$\beta = \alpha/\epsilon,$$

where ε is the predetermined strain of at least a portion of the sealant material, i.e. the portion being in contact with the inclined edge of the seat.

Other features which are considered as characteristic for the invention are set forth in the appended claims.

Although the invention is illustrated and described herein as embodied in a housing for electronic control unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION

Figure 1:
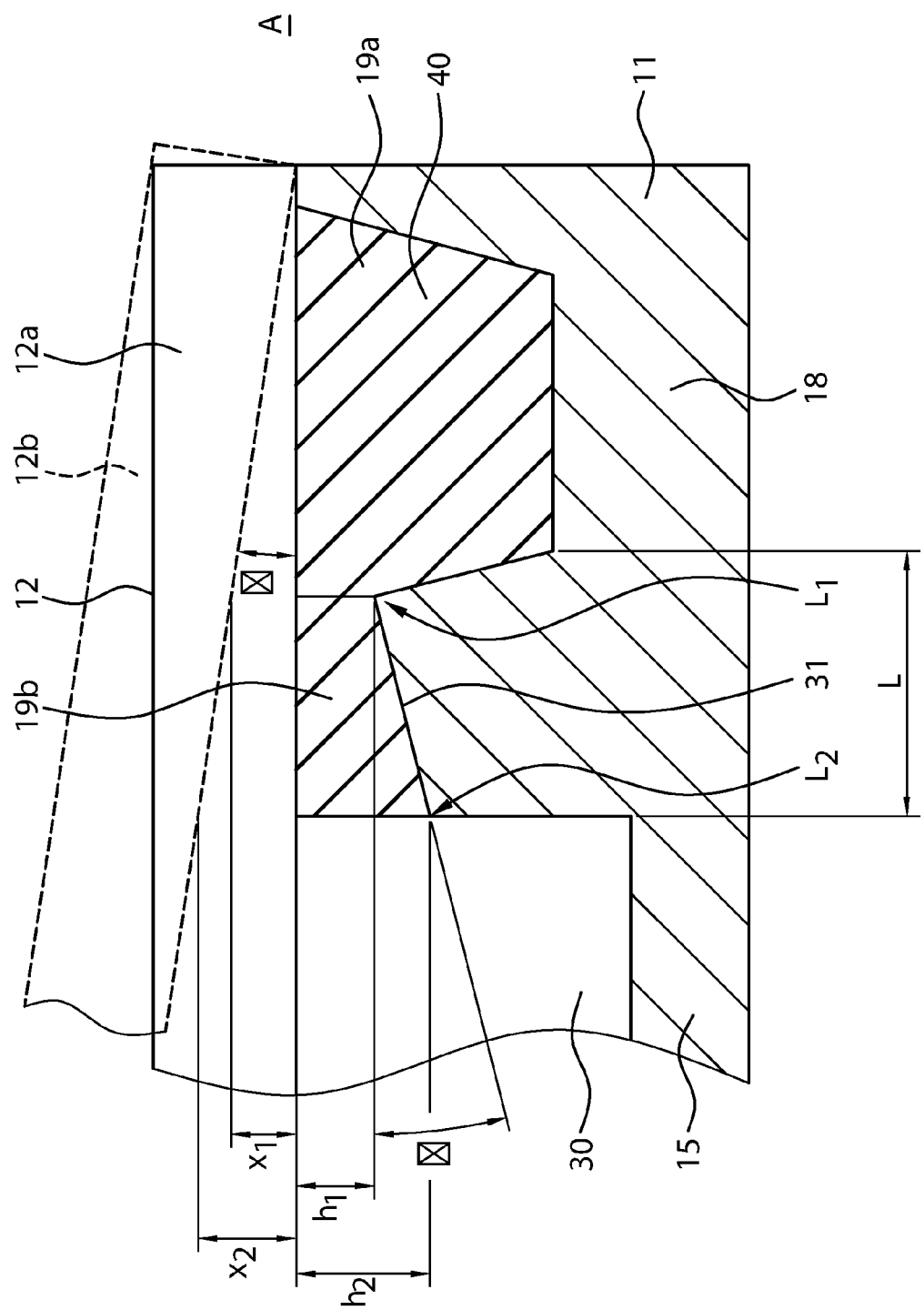
FIG. 1 is a diagrammatic, sectional view of a housing for an electronic control unit according to the present invention.

Referring now to the figures of the drawings in detail and first, particularly to FIG. 1 thereof, there is shown a housing 10 for an electronic control unit according to the present invention. The housing 10 contains a bottom main body 11 and a cover 12 joined together. The main body 11 is made of a plastic or metal material. The cover 12 is typically made of a generally flat metal sheet, of the same or of a different material with respect to the main body 11.

The main body 11 has a base 15 and a perimeter wall 18 rising from the base 15. The base 15, seen from a top view on an opening of the main body 11 in FIG. 2, which opening is surrounded by the perimeter wall 18 and covered by the cover 12 (the cover not being shown in FIG. 2) has a rectangular shape. According to different embodiment of the present invention, the base 15 may have a different shape, for example circular. The perimeter wall 18 is orthogonal to the base 15. According to different embodiments of the present invention (not shown) the perimeter wall 18 may be otherwise inclined with respect to the base 15.

On top of the perimeter wall 18, the cover 12 is supported and fixed in order to create a hollow structure with an inner volume 30 delimited by the base 15, the perimeter wall 18 and the cover 12 at least in places. The electronic control unit may include a non-illustrated electrical connector which covers a lateral opening of the main body 11 and contributes to delimit the inner volume 30. The inner volume 30 is subject to house a plurality of electronic components (not shown).

On top of the perimeter wall 18 the main body 11 includes a seat 19 for a sealant material 40, for example constituted by an O-ring or—preferably and in the present embodiment—a formed-in-place gasket made from a fluid sealing compound.

When the main body 11 and the cover 12 are joined together, the sealant 40 is interposed between the top of the perimeter wall 18 and the cover 12, preventing contamination, for example dust or other pollutants, to the inner volume 30 from the external environment, i.e. an outer volume A outside the housing 10.

The cover 12 has generally the same lateral shape and dimensions as the main body 11 in one embodiment, so that it may be basically flush with the main body 11.

The seat 19 contains an inner first portion 19a, not directly communicating with any of the inner volume 30 and the outer volume A, and a second portion 19b communicating with the inner volume 30. The cover 12 bears on the wall 18 in a region which follows the portion 19b and the further portion 19a in lateral outward direction. The first portion 19a and the second portion 19b shape a gap between the cover 12 and the main body 11 which extends continuously in lateral inward direction from the bearing region in which the cover 12 directly adjoins the wall 18 to an inner surface of the wall 18 where the second portion 19b adjoins the inner volume 30.

The first portion 19a of the seat 19 together with the cover 12 shapes a region of the gap that is generally trapezoidal in shape. Other shapes are in general also possible, for example circular or rectangular.

Figure 2:
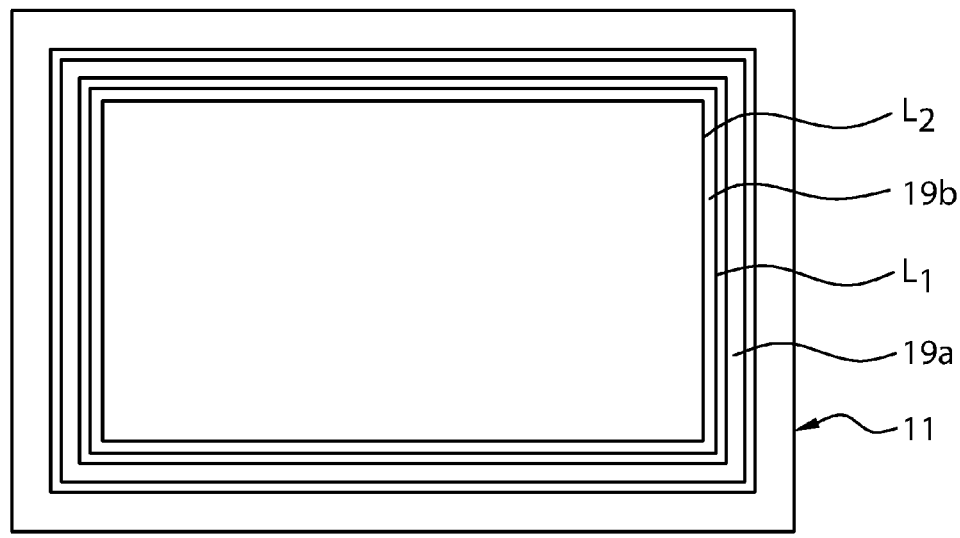
FIG. 2 is a top view of a main body of the housing shown in FIG. 1.
Figure 3:
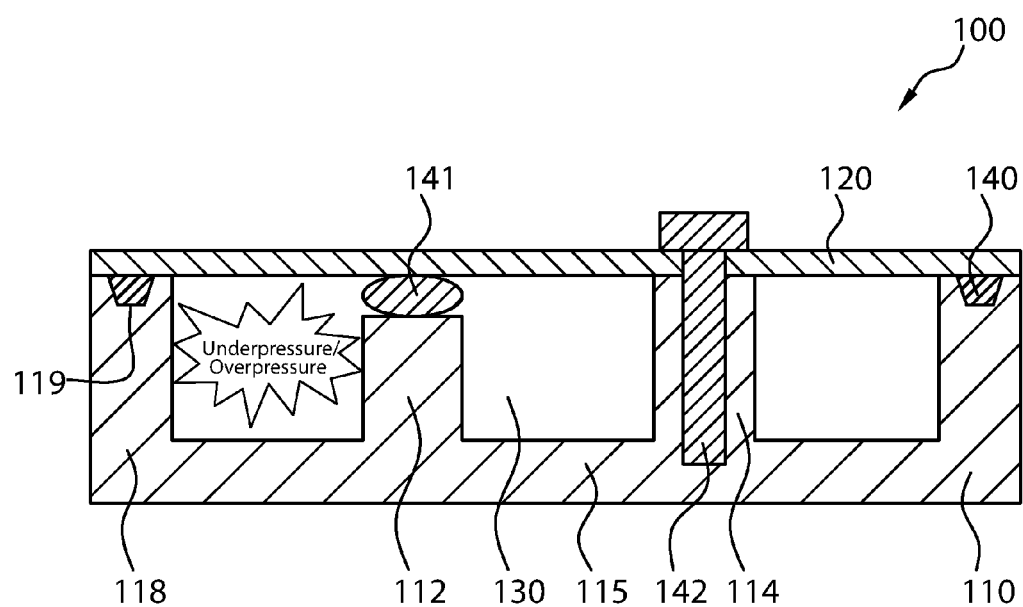
FIG. 3 is a sectional view of a housing for an electronic control unit.

The second portion 19b, in the embodiment of FIG. 1 and FIG. 2, is interposed between the inner volume 30 of the housing 10 and the inner first portion 19a of the seat 19 in lateral direction. In this embodiment the cover 12 is expected to deform, for example, towards the outer volume A. In other words, the cover 12 is deformable from an undeformed configuration 12a to a deformed configuration 12b, the gap having a larger width in the deformed configuration.

According to another embodiment (not shown) the second portion 19b is interposed between the outer volume A and the inner first portion 19a of the seal 19. In this embodiment, the bearing region may be position laterally inward of the gap. The embodiment may be preferable when the cover 12 is expected to have its maximum deflection towards the inner volume 30 from the undeformed configuration 12a to the deformed configuration 12b. The gap width increases in the course from the undeformed configuration to the deformed configuration 12b also in this embodiment.

The second portion 19b is delimited, in lateral direction by the first portion 19a and by the inner volume 30. In a direction pointing from the base 15 to the cover 12, i.e. in direction of the gap width, the gap is delimited in the region of the second portion 19b of the seat 19 by the cover 12 and by an edge 31 of the second portion 19b, the edge 31 being inclined with respect to the cover 12. The edge 31 is in particular inclined—or curved—with respect to the cover 12 even when the cover 12 is in the undeformed configuration 12a in which the pressures in the inner volume 30 and the outer volume A are in particular equal.

The inclined edge is in particular formed by a surface of the seat 19 which extends oblique or curved relative to the cover 12 in the undeformed state to establish a gap of laterally changing width and which represents the second portion 19b. The gap is bridged by the sealant 40 and in the present embodiment completely filled with the sealant 40. The inclined edge 31 extends from a first lateral end position L1 distanced from the inner volume 30 to a second lateral end position L2 in contact with the inner volume 30. The inclination β of the edge 31 is may be proportional to an expected angle α of deformation of the cover 12, according to the relationship:

$$\beta = \alpha/\epsilon,$$

where $$\beta = h_2 - h_1/L,$$

being $h_1$, $h_2$ the gap widths at the first and second lateral end positions L1 and L2 in the undeformed configuration 12a of the cover 12 and L being the lateral dimension of the inclined edge 31—i.e. the distance between the end positions L1 and L2 —, and where:

$$\alpha = x_2 - x_1/L,$$

$x_1$ and $x_2$ being respectively, the distances from the undeformed configuration 12a to the deformed configuration 12b at the lateral end positions L1, L2—in other words the change of gap width at the lateral end positions L1 and L2 when the cover 12 is deflected from the undeformed configuration 12a to the deformed configuration 12b—and where:

$$\epsilon = \epsilon_1 = x_1/h_1 = \epsilon_2 = x_2/h_2$$

is the strain of the sealant material 40 at the extreme points L1, L2 of the projection L, i.e. the strain of a portion of the sealant material 40 in the second portion 19b of the seat 19.

In other words the slope of the edge 31 is determined by imposing that the strains;

$$\epsilon_1 = x_1/h_1; \epsilon_2 = x_2/h_2$$

at the location of L1 and L2 are equal, i.e.:

$$\epsilon = x_1/h_1 = x_2/h_2.$$

By predetermining a maximum allowable strain c of the sealant 40, the gap widths $h_1$ and $h_2$—and thus also the slope of the inclined edge 31—are to be obtained from the expected deflection $x_1$, $x_2$ of the cover 12:

$$h_1 = x_1/\epsilon, \text{ and}$$

$$h_2 = x_2/\epsilon.$$

In this way, the cover 12 and the inclined edge 31 defines a shape of the gap between the main body 11 and the cover 12 having a width which increases in lateral inward direction towards the inner volume 30. To put it differently, the width of the gap tapers from a first width at the interface of the portion 19b with the inner volume 30 in lateral outward direction towards the outer volume A along the inclined edge 31 and subsequently increases to a second width within the further portion 19a. In the present embodiment, the second width is larger than the first width.

The invention claimed is:

1. A housing for an electronic control unit, the housing comprising:
   a main body having a base and a wall rising from said base;
   a cover supported on said wall opposite to said base and fixed to the housing for defining an inner volume of the housing, said wall having an inner surface, said inner volume of the housing having an outer boundary limited by said inner surface of said wall;
   a sealant; and
   a seat disposed on said wall for said sealant and interposed between said main body and said cover contributing to isolate said inner volume from an outer volume outside the housing, said seat having at least a portion adjoining said inner volume, said portion having an inclined edge on said wall inclined with respect to said cover;
   said inclined edge extending to said inner volume; and
   said sealant disposed on said portion of said seat having said inclined edge.

2. The housing according to claim 1, wherein said portion adjoins the inner volume and said cover and said inclined edge shape a gap between said main body and said cover having a width which increases in a lateral inward direction towards the inner volume, said gap being bridged by said sealant.

3. The housing according to claim 2, wherein said seat contains at least a further portion on a side remote from the inner volume which said portion adjoins.

4. The housing according to claim 3, wherein said cover bears on said wall in a region which follows said portion and said further portion in the lateral outward direction.

5. The housing according to claim 3, wherein said cover is deformable from an undeformed configuration to a deformed configuration due to pressure differences between the inner volume and the outer volume, and said inclined edge, in a cross-sectional view of said gap, extends from a first lateral end position distanced from the inner volume or from the outer volume to a second lateral end position in contact with the inner volume or with the outer volume.

6. The housing according to claim 3, wherein said further portion has a trapezoidal cross-sectional shape.

7. The housing according to claim 3, wherein said portion and said further portion shape a further gap between said main body and said cover having a width which tapers from a first width at an interface of said portion with the inner volume in lateral outward direction towards the outer volume along said inclined edge and subsequently increases to a second width within said further portion, the second width being larger than the first width, said gap being filled with said sealant in a region of said further portion.

8. A housing for an electronic control unit, the housing comprising:
   a main body having a base and a wall rising from said base;
   a cover supported on said wall opposite to said base and fixed to the housing for defining an inner volume of the housing, said wall having an inner surface, said inner volume of the housing having an outer boundary limited by said inner surface of said wall;
   a sealant;
   a seat disposed on said wall holding said sealant and interposed between said main body and said cover contributing to isolate the inner volume from an outer volume outside the housing, said seat having at least a portion adjoining the inner volume, said portion having an inclined edge on said wall inclined with respect to said cover, said portion adjoining the inner volume, and said cover and said inclined edge shape a gap between said main body and said cover having a width which increases in a lateral inward direction towards the inner volume, said gap being bridged by said sealant;
   said seat having at least a further portion on a side remote from the inner volume which said portion adjoins;
   said cover bearing on said wall in a region following said portion and said further portion in the lateral outward direction;
   said inclined edge extending to said inner volume; and
   said sealant disposed on said portion of said seat having said inclined edge.

9. The housing according to claim 8, wherein the predetermined strain is a maximum allowable strain of said sealant.

10. The housing according to claim 8, wherein said further portion has a trapezoidal cross-sectional shape.

11. The housing according to claim 8, wherein said portion and said further portion shape a further gap between said main body and said cover having a further width which tapers from a first width at an interface of said portion with the inner volume in the lateral outward direction towards the outer volume along said inclined edge and subsequently increases to a second width within said further portion, the second width being larger than the first width, said further gap being filled with said sealant in a region of said further portion.

12. The housing according to claim 8, wherein said cover extends directly over said seat solely in a flat manner.

13. The housing according to claim 1, wherein said cover extends directly over said seat solely in a flat manner.

* * * * *